(12) United States Patent
Horng et al.

(10) Patent No.: US 7,061,065 B2
(45) Date of Patent: Jun. 13, 2006

(54) LIGHT EMITTING DIODE AND METHOD FOR PRODUCING THE SAME

(75) Inventors: Ray-Hua Horng, Taichung (TW);
Tung-Hsing Wu, Taichung (TW);
Shao-Hua Huang, Ping-Chen (TW);
Chi-Ying Chiu, Nan-Tou County (TW)

(73) Assignee: National Chung-Hsing University, Taichung (TW)

( * ) Notice: Subject to any disclaimer, the term of this patent is extended or adjusted under 35 U.S.C. 154(b) by 0 days.

(21) Appl. No.: 10/405,811

(22) Filed: Mar. 31, 2003

(65) Prior Publication Data

US 2004/0188791 A1    Sep. 30, 2004

(51) Int. Cl.
*H01L 29/72* (2006.01)

(52) U.S. Cl. .................. 257/434; 257/435; 257/437; 257/438

(58) Field of Classification Search ........... 257/434, 257/435, 437, 438
See application file for complete search history.

(56) References Cited

U.S. PATENT DOCUMENTS 5,344,517 A * 9/1994 Houlding .................... 156/236
RE35,665 E * 11/1997 Lin et al. ...................... 257/94

* cited by examiner

*Primary Examiner*—Edward Wojciechowicz
(74) *Attorney, Agent, or Firm*—Charles E. Baxley

(57) ABSTRACT

The present invention discloses an LED (light emitting diode), which primarily includes a transparent window, such as a glass substrate, an LED epitaxial layer including at least an active layer, and a transparent conductive film formed between the transparent window and the LED epitaxial layer. The transparent conductive film can be oxides, nitrides or fluorides of metals, for example, ITO, InO, SnO, ZnO, etc. By involving the transparent conductive film, current spreading is improved and resistance is reduced because of larger cross section areas provided, particularly compared with the conventional spin on glass or polymer adhesives. Additionally, light-emitting efficiency can be improved since the conventional opaque substrate, such as a GaAs substrate on which the active layer is grown can be etched away after the transparent window and the active layer are combined with the transparent conductive film.

6 Claims, 5 Drawing Sheets

LIGHT EMITTING DIODE AND METHOD FOR PRODUCING THE SAME

BACKGROUND OF THE INVENTION

1. Field of the Invention

The present invention relates to a light emitting diode (LED) and a method for producing the same, and particularly to a light emitting diode including a transparent window and a transparent conductive film and a method for producing the same.

2. Description of the Related Prior Art

General processes for fabricating LEDs can be divided into up stream, middle stream and down stream. In the up stream, LPE (Liquid Phase Epitaxy), MBE (Molecular Beam Epitaxy) and MOVPE (Metal Organic Vapor Phase Epitaxy) are usually applied to producing single chips or epitaxial chips. In the middle stream, mask, dry or wet etching, vacuum vapor deposition and cutting are applied to forming dice. In the down stream, dice are placed on lead frames, and finally packaged as lamps, digit displays, dot matrix or surface mount, optionally.

In the up stream, GaAs and GaP are frequently served as substrates for depositing the light emitting material thereon. However, GaAs can absorb visible light emitted from double hetero-junction structure and GaP can absorb yellow-green wavelength, which significantly limit the application thereof. Theoretically, the external quantum efficiency ($\eta_{ext}$) is a product of the internal quantum efficiency ($\eta_{int}$) and the LED emitting efficiency ($\eta_{optical}$), that is, $\eta_{ext}=\eta_{int}\eta_{optical}$. The emitting efficiency is further influenced by absorption of the material itself ($\eta_A$), Fresnel loss ($\eta_{Fr}$), and total reflection critical angle ($\eta_{cr}$); that is, $\eta_{optical}=\eta_A\eta_{Fr}\eta_{cr}$. Among these factors, $\eta_{Fr}$ is caused by the large difference between $n_{LED}$ (refractive index of the LED illuminant media; ≈3.4) and $n_{air}$ (refractive index of the air; =1); that is, $\eta_{Fr}$=1.84 (by $\eta_{Fr}=4/[2+(\eta_{air}/n_{LED})+(n_{LED}/n_{air})]$. Therefore, if one material is provided for the LED and has a refractivity ranging between those of the air and the LED, $\eta_{Fr}$ will be greatly improved. A method for solving this problem is to coat a resin film (n=1.5), whereby the light transmission can be thus promoted 16.2%. However, the absorption of light by the substrates still exists.

R.O.C. Pat. No. 466,784 and 474,034 mentioned methods for producing the AlGaInP LED and the AlGaAs LED. In these methods, the GaAs substrate can be removed after a transparent substrate, such as glass, is attached to the LED epitaxial layer by thermal pressing or adhesives, such as spin on glass, polyimide, silicon resin, etc. Unfortunately, the adhesives easily result in bubbles at the interface. Additionally, current spreading is not satisfying by such methods, unless the cladding layer adjacent to the transparent substrate is thick enough, or a GaP layer used for oxidation barrier is thicker than 3 μm, which certainly increases the cost.

Therefore, it is desirable to provide an improved LED structure to mitigate and/or obviate the aforementioned problems.

SUMMARY OF THE INVENTION

An object of the present invention is to provide a light emitting diode (LED), which exhibits higher emitting efficiency, lower resistance and better current spreading than a conventional LED.

Another object of the present invention is to provide a method for producing the above LED, which is suitable for bonding a transparent substrate to an LED epitaxial layer.

The LED of the present invention primarily includes a transparent window, an LED epitaxial layer including at least an active layer and defining a front surface and a back surface, and a transparent conductive film formed between the transparent window and the front surface of the LED epitaxial layer.

The method for producing the LED is to first provide a transparent window and an LED epitaxial layer, wherein the LED epitaxial layer includes an active layer and defines a front surface and a back surface. Next, a transparent conductive film is formed between the transparent window and the front surface of the LED epitaxial layer. When the wafers are bonded by thermal-pressure, atoms of the transparent conductive film can well diffuse to the window and the epitaxial layer, which greatly enhance the association process.

The transparent window can be made of glass, sapphire, $Al_2O_3$, ZnSe, ZnS, ZnSSe, SiC, GaP, GaAsP, etc.

The transparent conductive film can be made of metal oxides, nitrides or fluorides, for example, material containing ITO, $In_2O_3$, $Sn_2O_3$ or ZnO. The transparent conductive film can be formed on the transparent window and/or the LED epitaxial layer, and then the transparent window is bonded to the LED epitaxial layer by thermal-pressure. Since the transparent conductive film can easily form ohmic contact without energy barrier with an ohmic contact layer of the LED, this film can serve as current spreading layer of an electrode.

The active layer of the LED epitaxial layer is not restricted, for example, AlGaInP-, AlGaAs- and GaN-based materials. A first cladding layer and a second cladding layer are usually respectively formed on the back surface and the front surface of the active layer. Additionally, an ohmic contact layer and/or an oxidation barrier for preventing the second cladding layer from oxidizing can be further formed between the active layer and the transparent conductive film. The first cladding layer, the second cladding layer, the oxidation barrier and the ohmic contact layer can be made from suitable material and depend on the active layer.

A reflective layer and/or a heat-transferring set can also be provided on the back surface of the LED epitaxial layer. The LED epitaxial layer can be flipped and then bonded to the heat-transferring set.

More detailed description about the present invention will be present in the following embodiments accompanying with drawings.

DETAILED DESCRIPTION OF THE PREFERRED EMBODIMENTS

Figure 1:
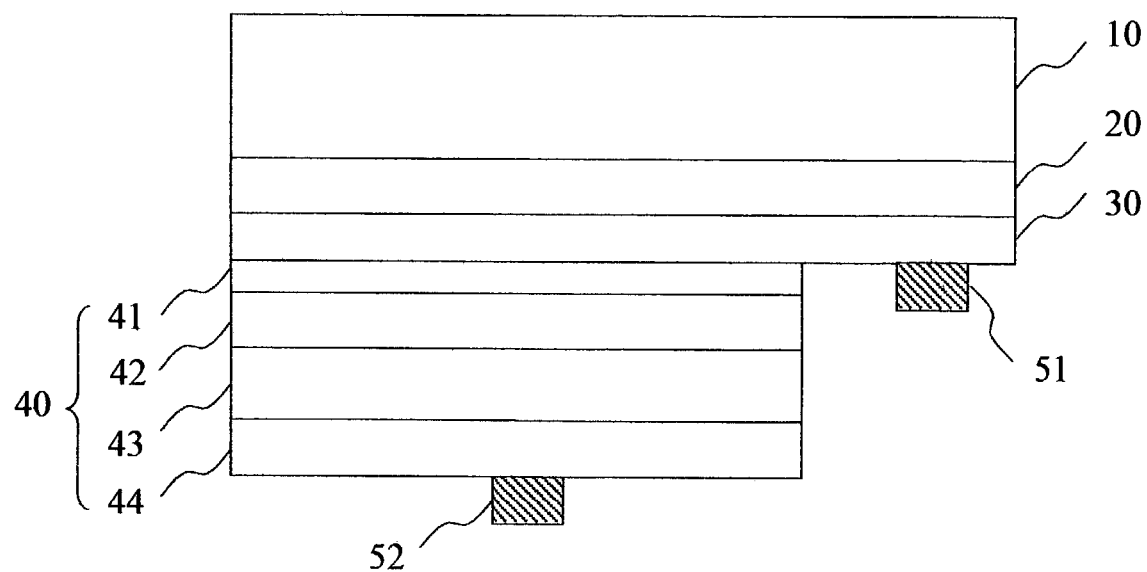
FIG. 1 is a cross section view of the first embodiment including the transparent conductive film.

Referring to FIG. 1, the first embodiment in accordance with the present invention includes a transparent window 10 made from glass, a transparent conductive film 20 made from ITO, a p-type ohmic contact layer 30, an LED epitaxial layer 40 formed on partial surface of the p-type ohmic contact layer 30, and a positive electrode 51 formed on other area of the p-type ohmic contact layer 30. The LED epitaxial layer 40 primarily includes an active layer 43 of undoped AlGaInP, wherein a front surface and a back surface are defined. Between the front surface and the transparent conductive film 20, a second cladding layer 42 of p-type AlGaInP and an oxidation barrier 41 of GaP for preventing the cladding layer 42 from oxidization are formed. On the back surface, a first cladding layer 44 of n-type AlGaInP is formed, on partial area of which the negative electrode 52 is formed.

The transparent conductive film 20 can be made from other materials than ITO. A thin film made from an oxide, a nitride or a fluoride, and having light transmission more than 80% within visible light range (wavelength 380–760 nm), and resistance lower than $1 \times 10^{-3}$ $\Omega \cdot cm$ can be applied. Examples of the oxides include $In_2O_3$ doping Sn (90–95% $In_2O_3$ and 10–5% $SnO_2$, represented as $In_2O_3$:Sn or ITO), $SnO_2$ doping Sb or F, and ZnO doping In, Ga (GZO) or Al(AZO). In this embodiment, ITO is used in view of its high transmission particularly in the middle range of visible light to which the human eyes are most sensitive, and low resistance (about $1.55 \times 10^{-4}$ $\Omega \cdot cm$). Moreover, ITO possesses strong adhesion to the glass substrate, and good stability in electricity and chemistry.

The active layer 42 of this embodiment is undoped AlGaInP, and represented by $(Al_xGa_{1-x})_yIn_{1-y}P$, wherein $0 \leq x \leq 1$, $0 \leq y \leq 1$, and preferably $0 \leq x \leq 0.5$, $0.3 \leq y \leq 0.7$. AlGaInP can be applied to high-brightness red, orange, yellow and yellow-green LED with double hetero-junction (DH) and quantum well (QW) structure. Mass production can be achieved by MOVPE. In general, AlGaAs is also suitable for the active layer 42 in the present invention. However, the red AlGaInP LED exhibits longer life in high temperature and high moisture than the red AlGaAs LED, so that the AlGaAs may be gradually replaced with AlGaInP.

Figure 2:
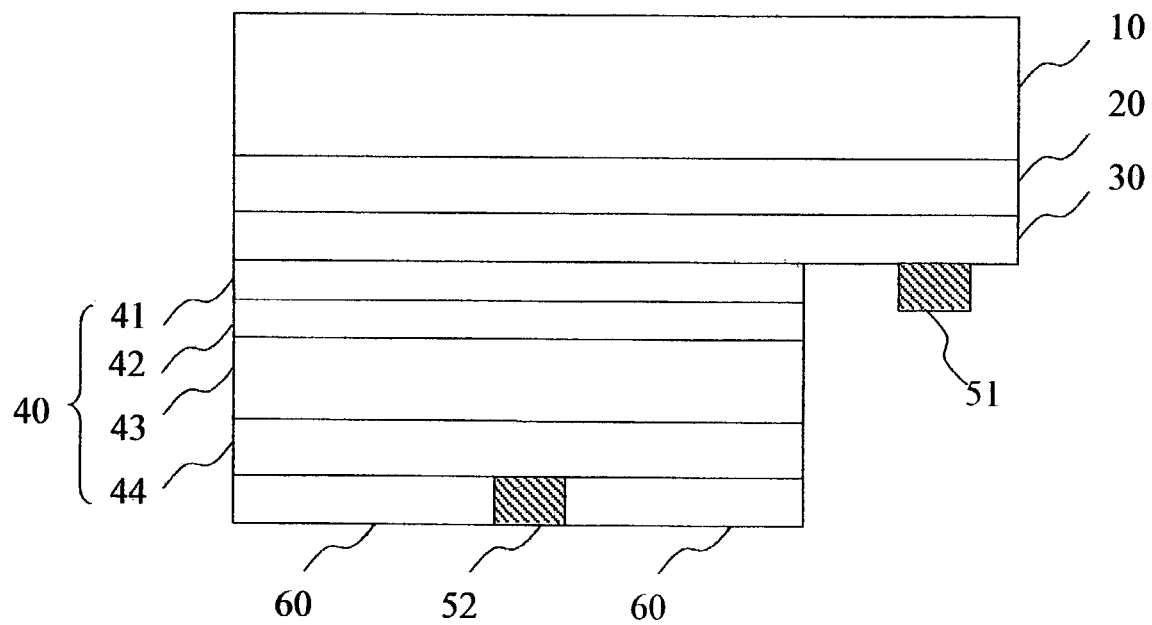
FIG. 2 is a cross section of the second embodiment, which has a p-type electrode formed on the ohmic contact layer, and includes the reflective layer.

FIG. 2 shows a cross section view of the second embodiment, in which a reflective layer 60 is coated on the first cladding layer 44. Therefore, the LED in this embodiment can exhibit higher brightness than that shown in FIG. 1, because all light beams emit from the front side of the LED.

Figure 3:
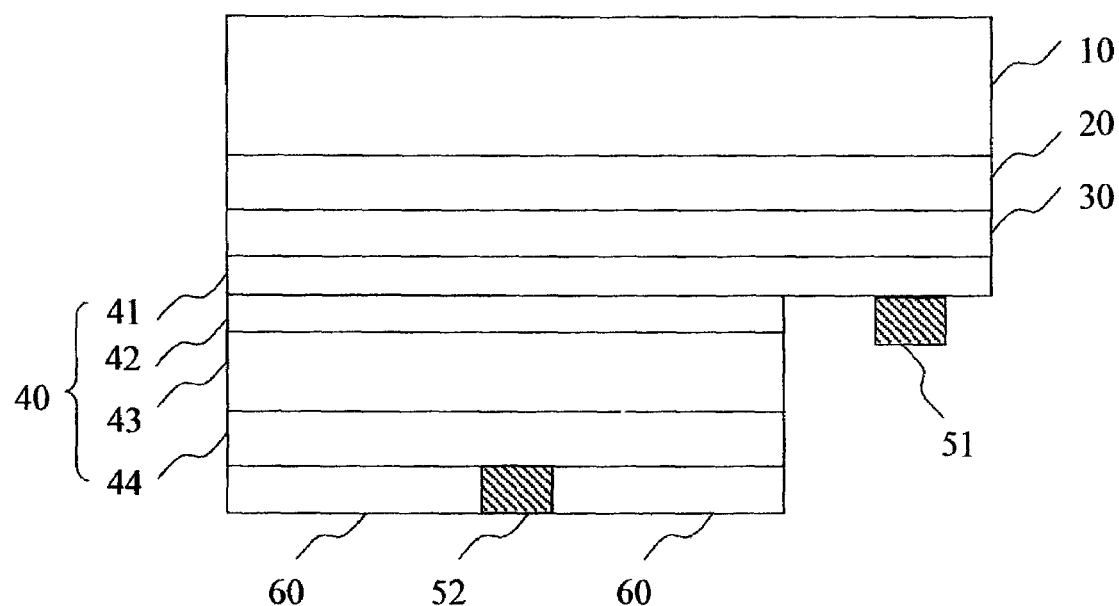
FIG. 3 is a cross section view of the third embodiment, which has a p-type electrode formed on the oxidation barrier, and includes the reflective layer.

FIG. 3 shows the third embodiment, which is similar to the second embodiment but the positive electrode 51 is moved to the GaP oxidation barrier 41 from the ohmic contact layer 30.

Figure 4:
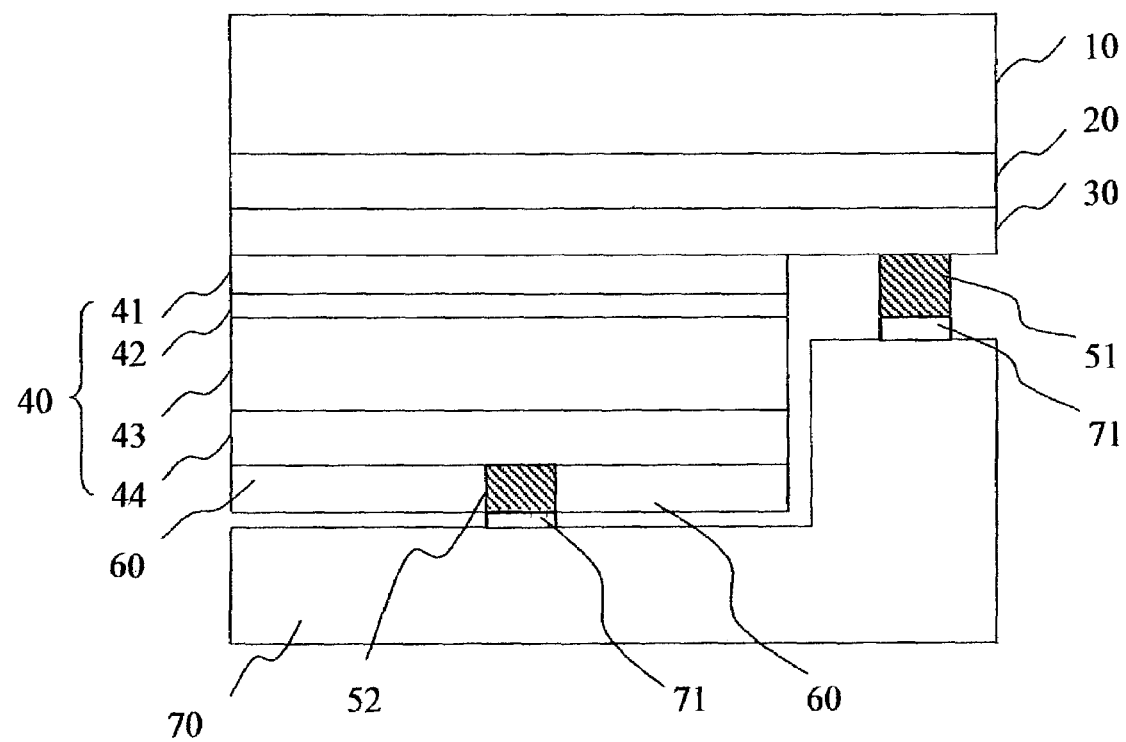
FIG. 4 is a cross section view of the forth embodiment, which includes the heat-transferring set.

FIG. 4 shows the forth embodiment, which is similar to the second embodiment but a heat-transferring set 70 is adhered to the electrodes 51, 52 with wire-bonding glue 71 during wire binding. Accordingly, heat caused by electric power can be brought away, and therefore life of the device is elongated.

Figure 5:
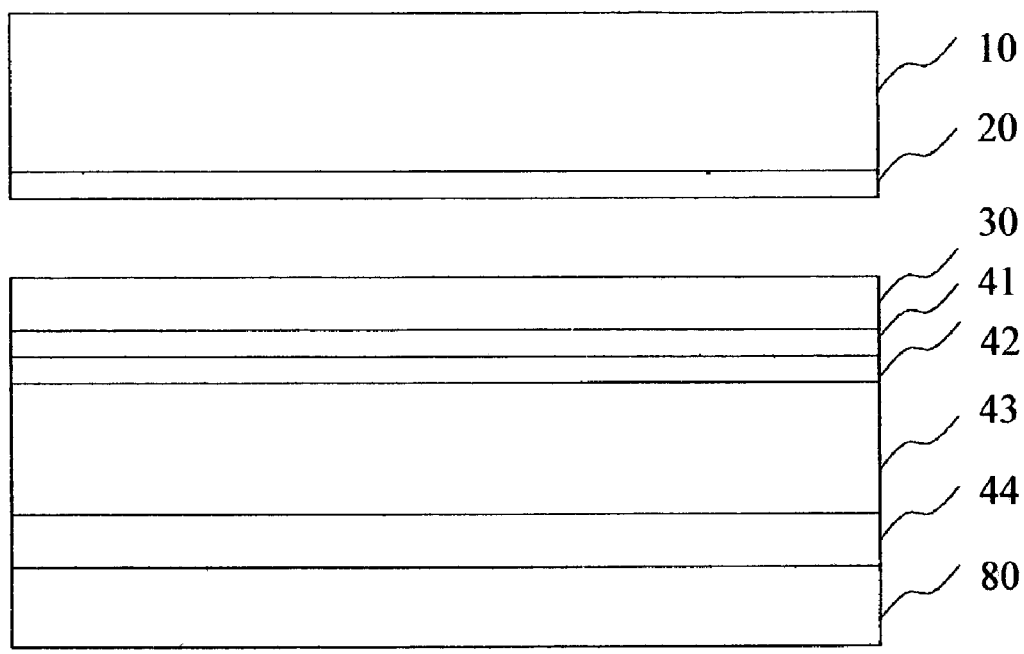
FIGS. 5 and 6 show the process for manufacturing the LED shown in FIG. 4.
Figure 6:
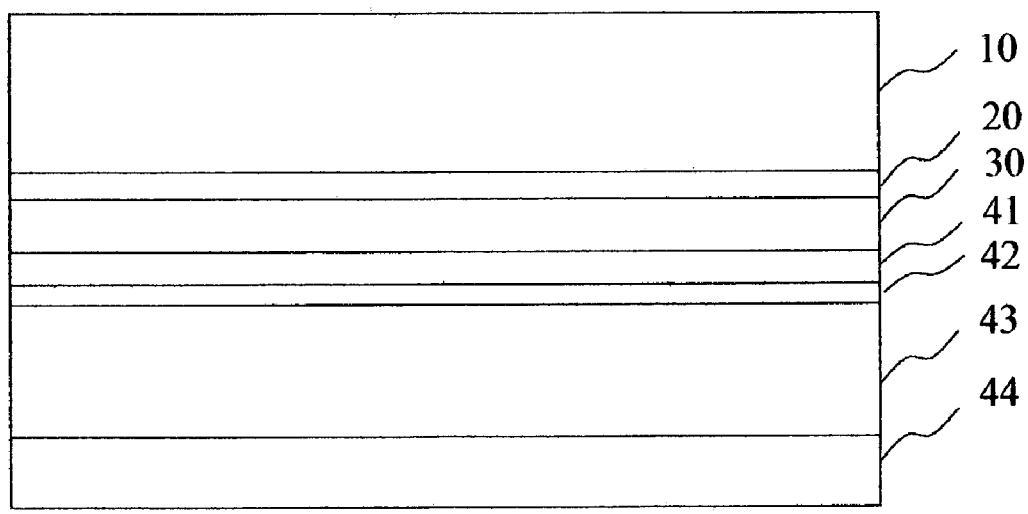

FIGS. 5 and 6 show the manufacturing process of the forth embodiment. First, on a GaAs substrate 80, the first cladding layer 44, the active layer 43, the second cladding layer 42, the oxidation barrier 41 and the ohmic contact layer 30 are sequentially deposited by epitaxy. Meanwhile, on the glass substrate 10, the ITO transparent conductive film 20 is deposited by sputtering, as shown in FIG. 5. Next, the transparent conductive film 20 is bonded to the ohmic contact layer 30 by thermal-pressure, and then the GaAs substrate 80 is removed by etching, as shown in FIG. 6. A part of the first cladding layer 44, the active layer 43, the second cladding layer 42 and the oxidation barrier 41 are then etched, whereby the positive and negative electrodes 51, 52 can be respectively formed on the ohmic contact layer 30 and the first cladding layer 44. The reflective layer 60 is coated on the first cladding layer 44, as shown in FIG. 2. At last, wires (not shown in figures) are bonded to the electrodes 51, 52 after flipping the chip, and the heat-transferring set 70 is adhered to the electrodes 51, 52 with the wire-bonding glue 71, and the LED as shown in FIG. 4 is eventually completed.

Figure 7:
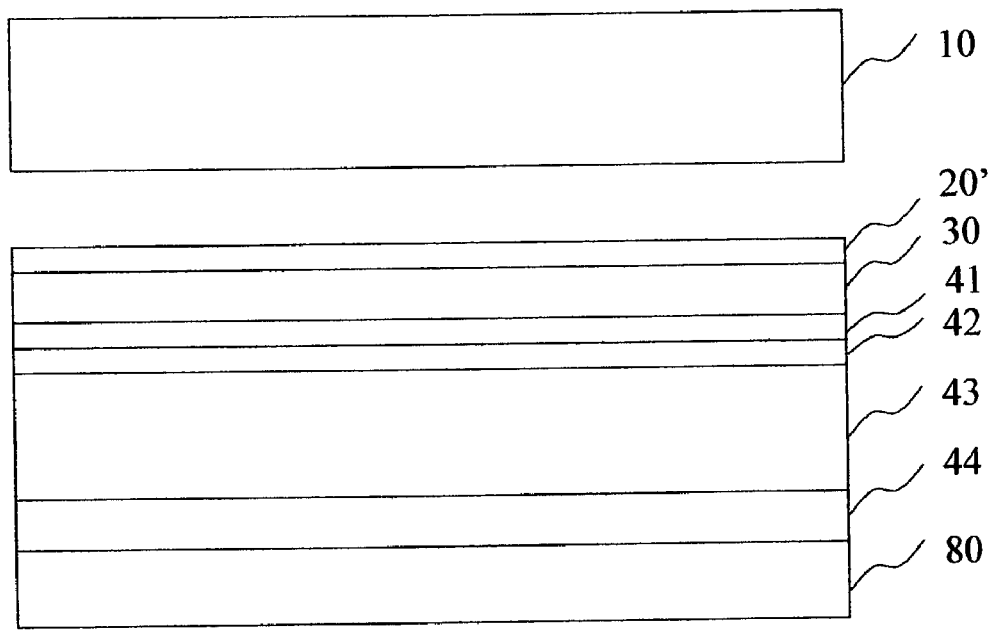
FIGS. 7 and 8 show the process for manufacturing the LED shown in FIG. 4, in which the transparent conductive film is formed by different ways.
Figure 8:
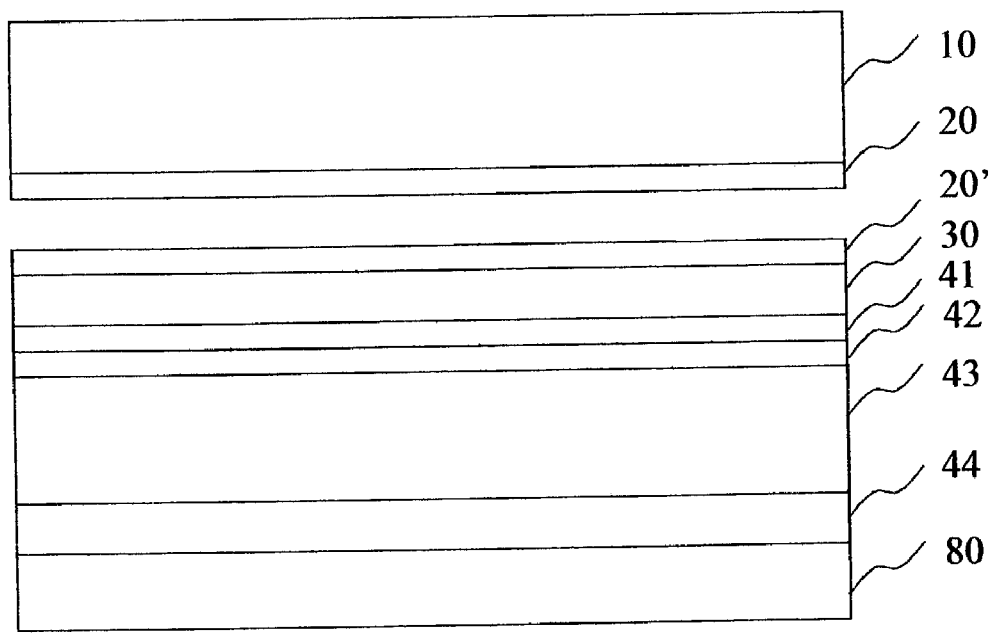

FIG. 7 shows a different way of the manufacturing process, in which the transparent conductive film 20' is first formed on the p-type ohmic contact layer 30, and then bonded to the glass substrate 10. As for FIG. 8, the transparent conductive films 20, 20' are respectively coated and deposited on the glass substrate 10 and the p-type ohmic contact layer 30, and then the transparent conductive films 20, 20' are bonded.

Figure 9:
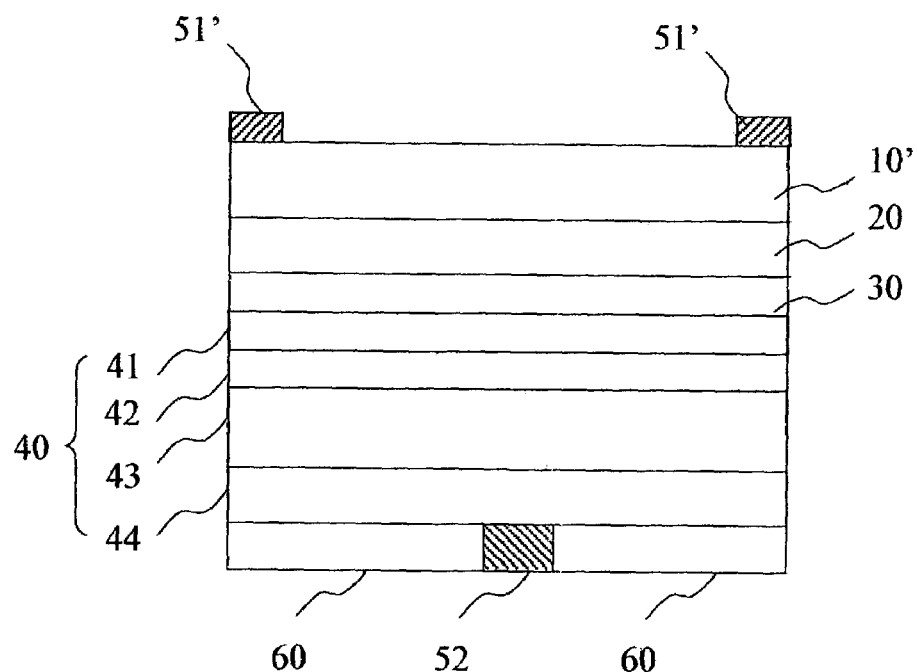
FIG. 9 shows the vertical LED structure according to the present invention.

FIG. 9 shows a vertical LED structure according to the present invention. In such structure, a p-type electrode 51' is formed on an edge of the bonded transparent conductive substrate 10', and the reflective layer 60 is added on the first cladding layer 44.

Figure 10:
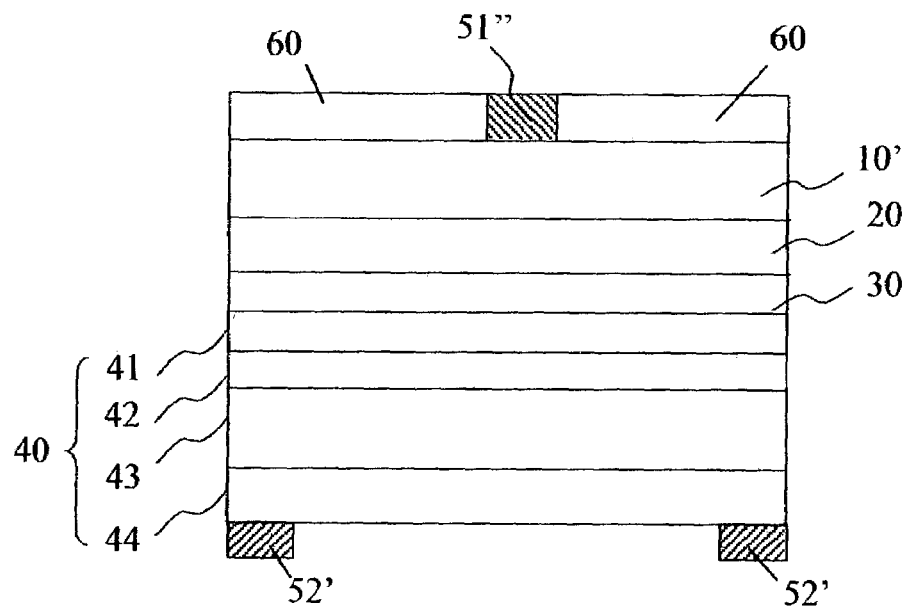
FIG. 10 shows another vertical LED structure according to the present invention.

FIG. 10 shows another vertical LED structure according to the present invention. In such structure, a p-type electrode 51'' is formed on the central part of the bonded transparent conductive substrate 10'. An n-type electrode 52' is formed on an edge of the first cladding layer 44. The reflective layer 60 is added on the conductive substrate 10', so that light can be emitted from different direction.

According to the present invention, the transparent conductive film, such as ITO, takes the place of the known spin on glass, polyimide and silicon resin, whereby the transparent substrate, such as glass, can be more easily associated with the epitaxial layer. Consequently, the light-emitting efficiency can be easily improved by removing the opaque substrate, such as GaAs. Moreover, resistance of the LED is reduced since the ohmic contact layer and the transparent conductive film provide larger cross area for current flowing therethrough, which is quite important for the LED requiring larger current. In addition, a $SiO_2$ film can be coated on the glass substrate before the ITO film is formed, which may enhance adhesion of the transparent conductive film.

In the present invention, sputtering deposition is used to form the transparent conductive film because the uniform film with a large area and a precise thickness can be more easily obtained by controlling input current of target material and sputtering time. Furthermore, attractive strength between the substrate and the film is ten times larger than films formed by general vapor deposition. The substrate also can be remained at lower operation temperature since the sputtering particles possess high energy which drives the particles diffuse at the interface to build a rigid and dense film. The method for producing the LED of the present invention can utilize the present technologies of semiconductor manufacturing, such as epitaxy, vapor deposition, sputtering deposition, thermal pressing, etc., without developing a new skill.

What is claimed is:

1. A light emitting diode, comprising:
    a transparent window;
    an LED epitaxial layer including at least an active layer, and defining a front surface and a back surface;
    an ohmic contact layer formed on said LED epitaxial layer;
    a transparent conductive film formed between said transparent window and said ohmic contact layer; and
    an oxidation barrier formed between said active layer of said LED epitaxial layer and said ohmic contact layer;
    wherein said transparent conductive film is made from metal oxide.

2. The light emitting diode as claimed in claim 1, wherein said transparent conductive film is selected from the group consisting of ITO, $In_2O_3$, $Sn_2O_3$ and ZnO.

3. The light emitting diode as claimed in claim 1, wherein said active layer is selected from the group consisting of AlGaInP-, AlGaAs- and GaN-based materials.

4. The light emitting diode as claimed in claim 1, which further comprises a reflective layer on said back surface of said LED epitaxial layer.

5. The light emitting diode as claimed in claim 1, which further comprises a heat-transferring set on said back surface of said LED epitaxial layer.

6. The light emitting diode as claimed in claim 1, wherein said transparent window substrate is electrically conductive.

* * * * *